US012564868B2

(12) United States Patent
    Inatomi

(10) Patent No.:    US 12,564,868 B2
(45) Date of Patent:         Mar. 3, 2026

(54) SUBSTRATE PROCESSING APPARATUS AND SUBSTRATE PROCESSING METHOD

(71) Applicant: Tokyo Electron Limited, Tokyo (JP)

(72) Inventor: Yuichiro Inatomi, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/261,578

(22) PCT Filed: Jan. 5, 2022

(86) PCT No.: PCT/JP2022/000105
    § 371 (c)(1),
    (2) Date: Jul. 14, 2023

(87) PCT Pub. No.: WO2022/158286
    PCT Pub. Date: Jul. 28, 2022

(65) Prior Publication Data
    US 2024/0066561 A1      Feb. 29, 2024

(30) Foreign Application Priority Data
    Jan. 19, 2021     (JP) ................................. 2021-006709

(51) Int. Cl.
    *B08B 3/02*        (2006.01)
    *C23C 18/18*       (2006.01)
    *H01L 21/67*       (2006.01)
(52) U.S. Cl.
    CPC .......... *B08B 3/022* (2013.01); *C23C 18/1875* (2013.01); *H01L 21/67028* (2013.01)
(58) Field of Classification Search
    CPC ........................... B08B 3/022; C23C 18/1875; H01L 21/67028
    See application file for complete search history.

(56) References Cited

U.S. PATENT DOCUMENTS

2014/0182631 A1 *   7/2014   Namba ............. H01L 21/67051
                                                              15/268

FOREIGN PATENT DOCUMENTS

JP        2009-187996 A      8/2009
JP        2010016315 A   *   1/2010
               (Continued)

OTHER PUBLICATIONS

Machine Translation of JP2010-016315A (Year: 2010).*
               (Continued)

*Primary Examiner* — Sharidan Carrillo
(74) *Attorney, Agent, or Firm* — Chrisman Gallo Tochtrop LLC

(57)                ABSTRACT

A substrate processing apparatus includes a substrate holder, a rotational driving unit, a cover body, a transfer mechanism, a cleaning liquid supply and a controller. The substrate holder is configured to hold a substrate. The rotational driving unit is configured to rotate the substrate holder. The cover body is configured to cover a top surface of the substrate held by the substrate holder. The transfer mechanism is configured to transfer a cleaning jig to the substrate holder. The cleaning liquid supply is configured to supply a cleaning liquid toward a bottom surface of the cleaning jig held by the substrate holder. The controller is configured to control the rotational driving unit to rotate the substrate holder. The cleaning jig is provided with at least one hole through which the cleaning liquid discharged from the cleaning liquid supply passes toward the cover body.

1 Claim, 8 Drawing Sheets

(56) References Cited

FOREIGN PATENT DOCUMENTS

| JP | 2014-130935 | A | 7/2014 |
| JP | 2015-050408 | A | 3/2015 |
| JP | 2018-003097 | A | 1/2018 |
| WO | 2020/100829 | A1 | 5/2020 |

OTHER PUBLICATIONS

Machine Translation of CN-107518828-B (Year: 2021).*
International Search Report for PCT/JP2022/000105 dated Mar. 1, 2022.

* cited by examiner

ROTATIONAL DIRECTION 45    43

41    40

START

S10
CARRYING-IN PROCESSING

S11
CLEANING PROCESSING

S12
FIRST RINSING PROCESSING

S13
PLATING PROCESSING

S14
SECOND RINSING PROCESSING

S15
DRYING PROCESSING

S16
CARRYING-OUT PROCESSING

END

*FIG. 8*

```
        ┌──────────────┐
        │    START     │
        └──────┬───────┘
               │              ┌S20
        ┌──────▼───────────────┐
        │ CARRYING-IN PROCESSING│
        └──────┬────────────────┘
               │              ┌S21
        ┌──────▼───────────────┐
        │  CLEANING PROCESSING  │
        └──────┬────────────────┘
               │              ┌S22
        ┌──────▼───────────────┐
        │   DRYING PROCESSING   │
        └──────┬────────────────┘
               │              ┌S23
        ┌──────▼───────────────┐
        │CARRYING-OUT PROCESSING│
        └──────┬────────────────┘
               │
        ┌──────▼───────┐
        │     END      │
        └──────────────┘
```

ROTATIONAL DIRECTION 51 50

43 43

41

42 42

51 51

43 43

51

Y

Z ⊙ → X

FIRST ROTATIONAL DIRECTION          SECOND ROTATIONAL DIRECTION $\theta 2$ $\theta 1$ 61

62

63

41

60

SUBSTRATE PROCESSING APPARATUS AND SUBSTRATE PROCESSING METHOD

CROSS-REFERENCE TO RELATED APPLICATIONS

This Application is a U.S. national phase application under 35 U.S.C. § 371 of PCT Application No. PCT/JP2022/000105 filed on Jan. 5, 2022, which claims the benefit of Japanese Patent Application No. 2021-006709 filed on Jan. 19, 2021, the entire disclosures of which are incorporated herein by reference.

TECHNICAL FIELD

The various aspects and embodiments described herein pertain generally to a substrate processing apparatus and a substrate processing method.

BACKGROUND

Patent Document 1 describes a substrate processing apparatus having a cover body that covers a substrate from above.

PRIOR ART DOCUMENT

Patent Document 1: Japanese Patent Laid-open Publication No. 2018-003097

SUMMARY

In an exemplary embodiment, a substrate processing apparatus includes a substrate holder, a rotational driving unit, a cover body, a transfer mechanism, a cleaning liquid supply and a controller. The substrate holder is configured to hold a substrate. The rotational driving unit is configured to rotate the substrate holder. The cover body is configured to cover a top surface of the substrate held by the substrate holder. The transfer mechanism is configured to transfer a cleaning jig to the substrate holder. The cleaning liquid supply is configured to supply a cleaning liquid toward a bottom surface of the cleaning jig held by the substrate holder. The controller is configured to control the rotational driving unit to rotate the substrate holder. The cleaning jig is provided with at least one hole through which the cleaning liquid discharged from the cleaning liquid supply passes toward the cover body.

BRIEF DESCRIPTION OF THE DRAWINGS

FIG. 8 is a flowchart for describing a heating unit cleaning processing according to the exemplary embodiment.

DETAILED DESCRIPTION

Hereinafter, exemplary embodiments of a substrate processing apparatus and a substrate processing method of the present disclosure will be described in detail with reference to the accompanying drawings. Further, it should be noted that the substrate processing apparatus and the substrate processing method of the present disclosure are not limited to the exemplary embodiments to be described below.

Overall Configuration

Figure 1:
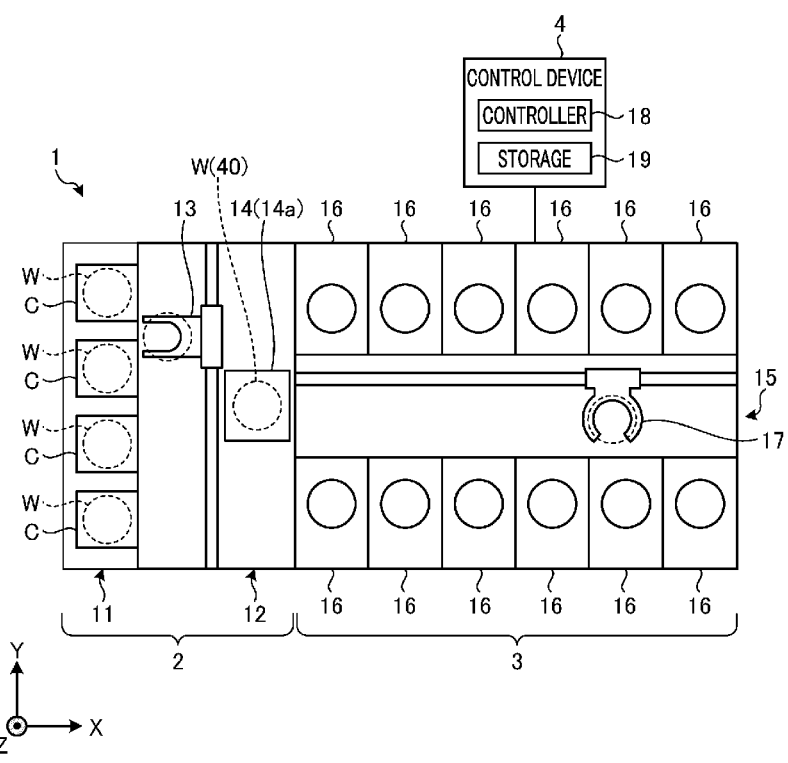
FIG. 1 is a diagram illustrating a schematic configuration of a substrate processing system according to an exemplary embodiment.

FIG. 1 is a diagram illustrating a schematic configuration of a substrate processing apparatus 1 according to an exemplary embodiment. In the following, to clarify positional relationship, the X-axis, the Y-axis and the Z-axis which are orthogonal to each other will be defined, and the positive Z-axis direction will be regarded as a vertically upward direction. Further, the X-axis direction will be regarded as a left-and-right direction.

As depicted in FIG. 1, the substrate processing apparatus 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of semiconductor wafers W (hereinafter, referred to as "wafers W") horizontally.

The transfer section 12 is provided adjacent to the carrier placing section 11, and provided with a substrate transfer device 13 and a delivery unit 14 therein. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 are arranged at both sides of the transfer section 15 in the Y-axis direction.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis, and transfers the wafers W between the delivery unit 14 and the processing units 16 by using the wafer holding mechanism. The substrate transfer device 17 includes an arm configured to hold the wafer W, a motor configured to move the arm, a sensor configured to detect the position of the arm, and so forth. The substrate transfer device 17 is capable of transferring a cleaning jig 40 to be described later. The substrate transfer device 17 (an example of a transfer mechanism) transfers the wafer W or the cleaning jig 40 to a substrate holder 21 to be described later.

The processing unit 16 is configured to perform a predetermined wafer processing on the wafer W transferred by the substrate transfer device 17. To be specific, the processing unit 16 performs a plating processing on the wafer W. The processing unit 16 performs a preset heating unit cleaning processing by using the cleaning jig 40 transferred by the substrate transfer device 17.

Further, the substrate processing apparatus 1 is provided with a control device 4. The control device 4 is, for example, a computer, and includes a controller 18 and a storage 19. The storage 19 stores therein a program for controlling various kinds of processings performed in the substrate processing apparatus 1. The controller 18 controls the operation of the substrate processing apparatus 1 by reading and executing the program stored in the storage 19. For example, the controller 18 rotates the substrate holder 21 by controlling a rotational driving unit 22 to be described later.

The program may have been recorded on a computer-readable recording medium, and may be installed from the recording medium to the storage 19 of the control device 4. The computer-readable recording medium may be, by way of non-limiting example, a hard disk HD, a flexible disk FD, a compact disk CD, a magnetic optical disk MO, a memory card, or the like.

In the substrate processing apparatus 1 configured as described above, the substrate transfer device 13 of the carry-in/out station 2 first takes out the wafer W from the carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into the processing unit 16.

The wafer W carried into the processing unit 16 is processed by the processing unit 16, and is then carried out from the processing unit 16 by the substrate transfer device 17 and placed on the delivery unit 14. Thereafter, the wafer W placed on the delivery unit 14 after being subjected to the required processing is returned back into the carrier C of the carrier placing section 11 by the substrate transfer device 13.

Further, after the plating processing is performed on a predetermined number of wafers W, for example, the substrate processing apparatus 1 carries the cleaning jig 40 into the processing unit 16, and performs the heating unit cleaning processing for the processing unit 16. Upon the completion of the heating unit cleaning processing, the substrate processing apparatus 1 carries out the cleaning jig 40 from the processing unit 16. When the heating unit cleaning processing is not performed, the cleaning jig 40 is placed in a placing section 14a provided at an upper portion or at a lower portion of the delivery unit 14.

<Configuration of Processing Unit>

Figure 2:
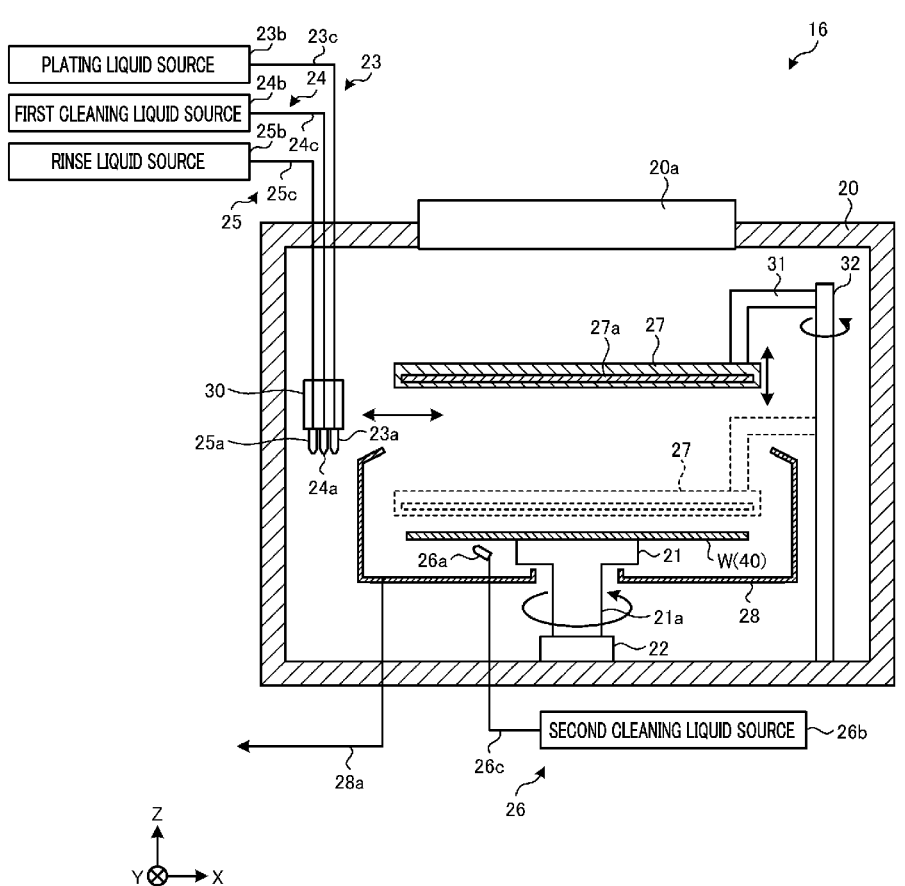
FIG. 2 is a schematic diagram illustrating a configuration of a processing unit according to the exemplary embodiment.

Now, a configuration of the processing unit 16 will be explained with reference to FIG. 2. FIG. 2 is a diagram illustrating the configuration of the processing unit 16 according to the exemplary embodiment. The processing unit 16 is configured to perform a plating processing on the wafer W. To be more specific, the processing unit 16 is configured to perform an electroless plating processing on the wafer W.

The processing unit 16 includes a chamber 20, the substrate holder 21, a rotational driving unit 22, a plating liquid supply 23, a first cleaning liquid supply 24, a rinse liquid supply 25, a second cleaning liquid supply 26, a heating unit 27, and a recovery cup 28.

The chamber 20 accommodates therein the substrate holder 21, the heating unit 27, the recovery cup 28, and so forth. A fan filter unit (FFU) 20a is provided at a ceiling portion of the chamber 20. The FFU 20a forms a downflow in the chamber 20.

The substrate holder 21 is configured to hold the wafer W (an example of a substrate). Specifically, the substrate holder 21 supports a bottom surface of the wafer W carried in by the substrate transfer device 17 (see FIG. 1), and holds the wafer W horizontally. The substrate holder 21 is of a vacuum chuck type configured to vacuum-attract the bottom surface of the wafer W. The substrate holder 21 attracts a central portion of the wafer W. The substrate holder 21 is also configured to hold the cleaning jig 40 in the same way as it holds the wafer W.

The substrate holder 21 is mounted to the rotational driving unit 22 with a rotation shaft 21a therebetween. The rotational driving unit 22 is, for example, a motor. As the rotational driving unit 22 is driven, the rotation generated by the rotational driving unit 22 is transmitted to the substrate holder 21 via the rotation shaft 21a, so that the substrate holder 21 is rotated. That is, the rotational driving unit 22 rotates the substrate holder 21. When the substrate holder 21 is rotated while holding the wafer W thereon, the wafer W is rotated along with the substrate holder 21. When the substrate holder 21 is rotated while holding the cleaning jig 40 thereon, the cleaning jig 40 is rotated along with the substrate holder 21. The rotational speed of the substrate holder 21, that is, the rotational speed of the wafer W and the rotational speed of the cleaning jig 40 are adjusted by the rotational driving unit 22.

In the following description, a rotational coordinate system centered on a rotation axis of the substrate holder 21 may be used for the explanation. For example, a radial direction centered on the rotation axis of the substrate holder 21 may be defined for the explanation.

Further, the substrate holder 21 is movable by a moving mechanism (not shown) such as a cylinder and a motor along an up-and-down direction. To elaborate, the substrate holder 21 is moved along the up-and-down direction between a delivery position and a processing position. The delivery position is a position above the recovery cup 28, and is a position where the wafer W or the cleaning jig 40 is delivered between the substrate transfer device 17 and the substrate holder 21. The processing position is below the delivery position, and is a position where the plating processing or the like is performed on the wafer W held by the substrate holder 21. Further, the processing position is a position where the heating unit cleaning processing is performed by using the cleaning jig 40. Further, the position where the plating processing or the like is performed on the wafer W may be different from the position where the heating unit cleaning processing is performed by using the cleaning jig 40.

The plating liquid supply 23 is configured to supply a plating liquid (an example of a processing liquid) to a top surface of the wafer W held by the substrate holder 21. The plating liquid supply 23 is equipped with a plating liquid supply nozzle 23a and a plating liquid source 23b. The plating liquid supply nozzle 23*a* is held by a nozzle arm 30. The nozzle arm 30 is movable along the left-and-right direction (X-axis direction) and the up-and-down direction (Z-axis direction).

The nozzle arm 30 is moved along the left-and-right direction and the up-and-down direction by a moving mechanism (not shown) such as a cylinder and a motor. The nozzle arm 30 is moved along the left-and-right direction between a first retreat position and a first raised position. The first retreat position is a position where the nozzle arm 30 is located radially outside the recovery cup 28, and is a position where the nozzle arm 30 does not hinder a movement of the heating unit 27 in the up-and-down direction. The first raised position is a position above the wafer W held by the substrate holder 21, and is a position moved along the X-axis direction from the first retreat position.

Further, the nozzle arm 30 is moved in the up-and-down direction between the first raised position and a first lowered position. The first lowered position is a position lower than the first raised position and higher than the wafer W held by the substrate holder 21.

The plating liquid supply nozzle 23*a* is connected to the plating liquid source 23*b* via a plating liquid supply line 23*c*. The plating liquid supply nozzle 23*a* is supplied with the plating liquid heated to a predetermined temperature from the plating liquid source 23*b*, and discharges this plating liquid onto the wafer W. As a result, the plating liquid is accumulated on the top surface of the wafer W.

The plating liquid is one for electroless plating. The plating liquid contains, for example, a metal ion such as a cobalt (Co) ion, a nickel (Ni) ion, a tungsten (W) ion, a copper (Cu) ion, a palladium (Pd) ion, a gold (Au) ion, or the like, and a reducing agent such as hypophosphorous acid, dimethyl amine borane, or the like. The plating liquid may contain an additive or the like. A plating film formed by the plating processing using the plating liquid may be, by way of non-limiting example, CoWB, CoB, CoWP, CoWBP, NiWB, NiB, NiWP, NiWBP, or the like.

The first cleaning liquid supply 24 includes a first cleaning liquid supply nozzle 24*a* and a first cleaning liquid source 24*b*. The first cleaning liquid supply nozzle 24*a* is held by the nozzle arm 30.

The first cleaning liquid supply nozzle 24*a* is connected to the first cleaning liquid source 24*b* via a first cleaning liquid supply line 24*c*. The first cleaning liquid supply nozzle 24*a* is supplied with the first cleaning liquid from the first cleaning liquid source 24*b*, and discharges the first cleaning liquid onto the top surface of the wafer W. The first cleaning liquid is, for example, an organic acid such as formic acid, malic acid, succinic acid, or citric acid, or hydrogen fluoride (DHF) diluted to a concentration that does not corrode a plating target surface of the wafer W.

The rinse liquid supply 25 is equipped with a rinse liquid supply nozzle 25*a* and a rinse liquid source 25*b*. The rinse liquid supply nozzle 25*a* is held by the nozzle arm 30.

The rinse liquid supply nozzle 25*a* is connected to the rinse liquid source 25*b* via a rinse liquid supply line 25*c*. The rinse liquid supply nozzle 25*a* is supplied with a rinse liquid from the rinse liquid source 25*b*, and discharges this rinse liquid to the wafer W. The rinse liquid is, for example, pure water.

The second cleaning liquid supply 26 is configured to supply a second cleaning liquid (an example of a cleaning liquid) toward the bottom surface of the wafer W (an example of the substrate) held by the substrate holder 21. The second cleaning liquid supply 26 (an example of a cleaning liquid supply) supplies the second cleaning liquid (an example of the cleaning liquid) toward a bottom surface of the cleaning jig 40 held by the substrate holder 21. The second cleaning liquid is, for example, pure water as a rinse liquid. In the following, the second cleaning liquid will be described as the rinse liquid.

The second cleaning liquid supply 26 is equipped with a second cleaning liquid supply nozzle 26*a* and a second cleaning liquid source 26*b*. The second cleaning liquid supply nozzle 26*a* is held by a nozzle holder (not shown). The second cleaning liquid supply nozzle 26*a* is connected to the second cleaning liquid source 26*b* via a second cleaning liquid supply line 26*c*.

The second cleaning liquid supply nozzle 26*a* is supplied with the rinse liquid from the second cleaning liquid source 26*b*, and discharges this second cleaning liquid to the bottom surface of the wafer W or the bottom surface of the cleaning jig 40. The second cleaning liquid supply nozzle 26*a* is configured to discharge the rinse liquid obliquely upwards from a radially inner side to a radially outer side. Further, the second cleaning liquid supply nozzle 26*a* may be supplied with the rinse liquid from the rinse liquid source 25*b*.

The heating unit 27 is of a circular plate shape. The heating unit 27 has a heater 27*a* inside. The heating unit 27 (an example of a cover body) is disposed so as to cover the wafer W (an example of the substrate) held by the substrate holder 21 or a top surface of the cleaning jig 40 held by the substrate holder 21 at a heating position to be described later. The heating unit 27 heats the wafer W supplied with the plating liquid from the top surface side of the wafer W. The heating unit 27 heats the plating liquid accumulated on the wafer W to form the plating film on the top surface of the wafer W. The heating unit 27 has a diameter larger than that of the wafer W. In addition, the diameter of the heating unit 27 is smaller than the opening diameter of the recovery cup 28. Further, the heating unit 27 may have an annular shape.

The heating unit 27 is mounted to a support 32 with an arm 31 therebetween. The arm 31 is rotatable about the support 32 by a moving mechanism (not shown) such as a cylinder and a motor, and is movable along the up-and-down direction.

For example, when rotation generated by a rotation motor (not shown) is transmitted to the arm 31, the heating unit 27 is rotated along with the arm 31. The heating unit 27 is rotated between a second retreat position and a second raised position. The second retreat position is a position outside the recovery cup 28 in the radial direction, and it is a position where the wafer W can be delivered between the substrate transfer device 17 (see FIG. 1) and the substrate holder 21. The second raised position is a position where the heating unit 27 covers the wafer W from above, and it is a position where the heating unit 27 lies substantially on the same axis as the substrate holder 21, for example. In FIG. 2, the heating unit 27 and the arm 31 placed at the second raised position are indicated by solid lines.

Moreover, the heating unit 27 is moved along the up-and-down direction between the second raised position and a heating position. The heating position is lower than the second raised position, and it is a position where the heating unit 27 does not come into contact with the plating liquid accumulated on the wafer W. The heating position is a position where the heating unit 27 heats the wafer W on which the plating liquid is accumulated. In FIG. 2, the heating unit 27 and the arm 31 located at the heating position are indicated by dashed lines.

The recovery cup 28 is positioned at a radially outer side than the substrate holder 21, and is disposed around the substrate holder 21. The recovery cup 28 receives a liquid scattered from the wafer W, for example, the plating liquid. The recovery cup 28 receives the rinse liquid scattered from the cleaning jig 40. The liquid collected by the recovery cup 28 is drained to the outside via a drain line 28a. Further, the drain line 28a has a plurality of paths, and these paths are switched depending on the liquid to be collected. The top of the recovery cup 28 is opened such that the substrate holder 21 holding the wafer W or the cleaning jig 40 and the heating unit 27 can be moved in the up-and-down direction.

<Cleaning Jig>

Figure 3:
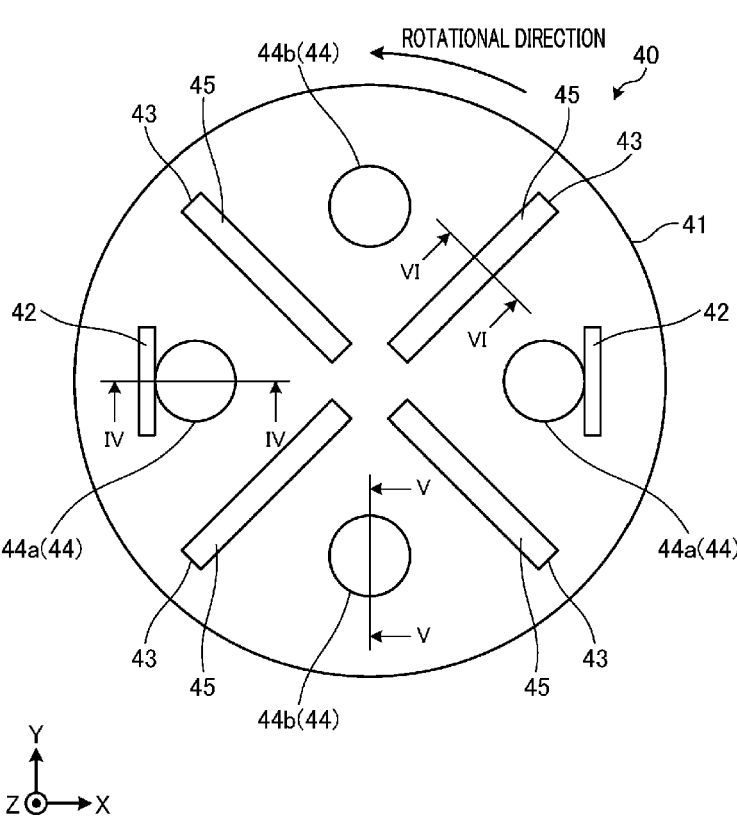
FIG. 3 is a plan view illustrating a configuration of a cleaning jig according to the exemplary embodiment.
Figure 4:
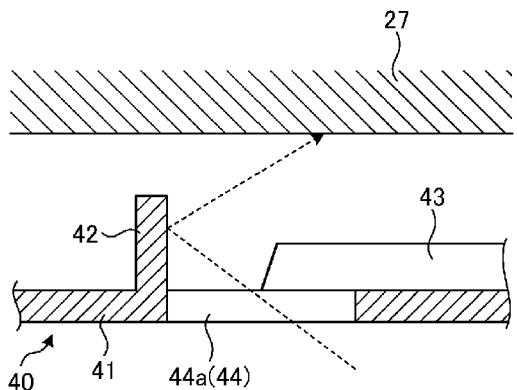
FIG. 4 is a cross sectional view of the cleaning jig according to the exemplary embodiment, taken along line IV-IV of FIG. 3.
Figure 5:
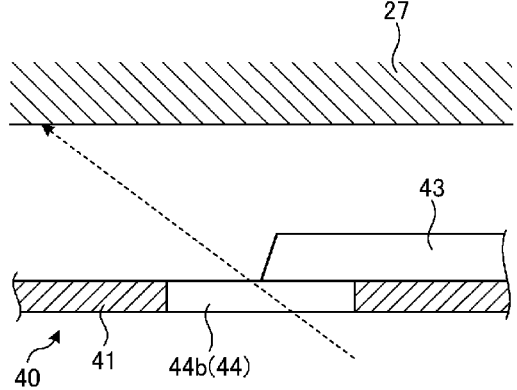
FIG. 5 is a cross sectional view of the cleaning jig according to the exemplary embodiment, taken along line V-V of FIG. 3.
Figure 6:
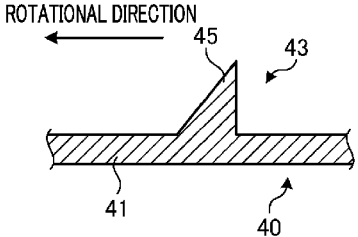
FIG. 6 is a cross sectional view of the cleaning jig according to the exemplary embodiment, taken along line VI-VI of FIG. 3.

Next, a configuration of the cleaning jig 40 will be described with reference to FIG. 3 to FIG. 6. FIG. 3 is a plan view showing the configuration of the cleaning jig 40 according to the exemplary embodiment. FIG. 4 is a cross sectional view of the cleaning jig 40 according to the exemplary embodiment, taken along line IV-IV of FIG. 3. FIG. 5 is a cross sectional view of the cleaning jig 40 according to the exemplary embodiment, taken along line V-V of FIG. 3. FIG. 6 is a cross sectional view of the cleaning jig 40 according to the exemplary embodiment, taken along line VI-VI of FIG. 3.

The cleaning jig 40 includes a plate member 41, at least one wall member 42, and at least one blade member 43.

The plate member 41 has the same exterior shape as the wafer W, and is, for example, of a circular shape. By way of example, the plate member 41 has a diameter equal to that of the wafer W. The plate member 41, which is held by the substrate holder 21, is provided with at least one hole 44. The hole 44 is formed so as to pass therethrough the rinse liquid (an example of the cleaning liquid) discharged from the second cleaning liquid supply 26 (an example of the cleaning liquid supply) toward the heating unit 27 (an example of the cover body). The hole 44 is formed in a circular shape, for example.

The hole 44 formed in the plate member 41 is plural in number. To be specific, four holes 44 are formed in the plate member 41. The four holes 44 are formed at an equal distance therebetween in the circumferential direction of the plate member 41, for example. That is, the four holes 44 are formed at an angular interval of 90 degrees in the circumferential direction of the plate member 41. Here, however, the number of the holes 44 is not limited thereto, and it may be one, two or three, or more than four.

The wall member 42 is formed such that the rinse liquid (an example of the cleaning liquid) having passed through the hole 44 after being discharged from the second cleaning liquid supply 26 collides with it. Specifically, the wall member 42 is formed so as to extend toward the heating unit 27 (an example of the cover body) from the plate member 41 at the radially outer side than the hole 44. For example, the wall member 42 is formed so as to be orthogonal to the plate member 41. The wall member 42 may be plural in number. The number of the wall members 42 may be, for example, two. These wall members 42 are provided near the holes 44 facing each other with the center of the plate member 41 therebetween. Here, however, the number of the wall members 42 is not limited to the shown example, and may be one, or more than two.

Hereinafter, among the plurality of holes 44 formed in the plate member 41, the hole 44 near which the wall member 42 is formed will sometimes be referred to as "first hole 44a", and the hole 44 near which the wall member 42 is not formed will sometimes be referred to as "second hole 44b".

When the cleaning jig 40 is rotated within the chamber 20, the blade member 43 generates a swirling flow above the cleaning jig 40. The blade member 43 is formed so as to extend from the plate member 41 toward the heating unit 27

(an example of the cover body). The blade member 43 is formed so as to extend along the radial direction of the plate member 41. The blade member 43 is formed so as to extend obliquely upwards from the plate member 41 between the two holes 44. The blade member 43 has an inclined surface 45 inclined with respect to the plate member 41. The inclined surface 45 is formed on a surface of the blade member 43 on the upstream side in the rotational direction of the cleaning jig 40. The blade member 43 is plural in number, for example. By way of example, the number of the blade members 43 may be four. However, the number of the blade members 43 is not limited thereto, and it may be one, two, three, or more than four.

<Plating Processing>

Figure 7:
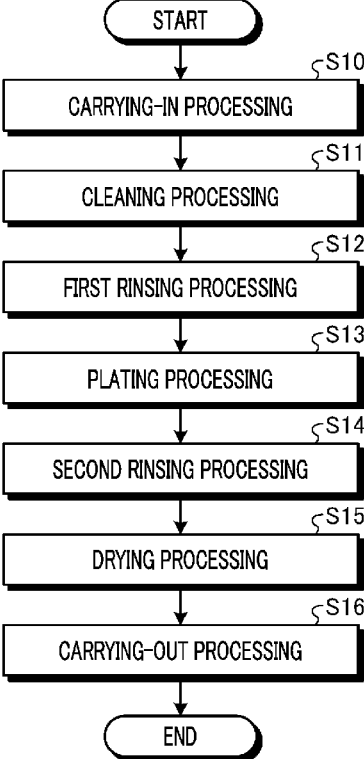
FIG. 7 is a flowchart for describing a plating processing according to the exemplary embodiment.

Now, the plating processing according to the exemplary embodiment will be described with reference to FIG. 7. FIG. 7 is a flowchart illustrating the plating processing according to the exemplary embodiment.

The substrate processing apparatus 1 performs a carrying-in processing (S10). Specifically, in the substrate processing apparatus 1, the wafer W is carried into the chamber 20 by the substrate transfer device 17, and the wafer W is held by the substrate holder 21. The substrate holder 21 attracts the bottom surface of the wafer W to hold the wafer W horizontally.

The substrate processing apparatus 1 performs a cleaning processing (S11). Specifically, the substrate processing apparatus 1 performs the cleaning of the wafer W by discharging the cleaning liquid from the first cleaning liquid supply nozzle 24a while rotating the substrate holder 21 to rotate the wafer W. Further, the rotational speed of the wafer W in the cleaning processing and individual processings to be described below is adjusted for each of the processings. The rotational speed of the wafer W in each processing may be changed in the middle of the corresponding processing.

The substrate processing apparatus 1 performs a first rinsing processing (S12). Specifically, the substrate processing apparatus 1 washes away the cleaning liquid remaining on the wafer W by discharging the rinse liquid from the rinse liquid supply nozzle 25a while rotating the wafer W. Further, the substrate processing apparatus 1 cleans the bottom surface of the wafer W by discharging the rinse liquid from the second cleaning liquid supply nozzle 26a.

The substrate processing apparatus 1 then performs a plating processing (S13). Specifically, the substrate processing apparatus 1 supplies the plating liquid from the plating liquid supply nozzle 23a while rotating the wafer W. As a result, the plating liquid is accumulated on the wafer W.

After the plating liquid is accumulated on the wafer W, the substrate processing apparatus 1 lowers the heating unit 27 to the heating position to heat the plating liquid accumulated on the wafer W. Further, the substrate processing apparatus 1 may heat the plating liquid while changing the heating position of the heating unit 27. Furthermore, the substrate processing apparatus 1 may be provided with an inert gas supply (not shown), and the plating liquid may be heated by the heating unit 27 after an inert gas is discharged into the chamber 20 by the inert gas supply. In addition, the substrate processing apparatus 1 may heat the plating liquid after stopping the rotation of the wafer W.

The substrate processing apparatus 1 then performs a second rinsing processing (S14). Specifically, after moving the heating unit 27 to the retreat position, the substrate processing apparatus 1 cleans the wafer W with the rinse liquid by discharging the rinse liquid from the rinse liquid supply nozzle 25a and the second cleaning liquid supply nozzle 26a while rotating the wafer W.

The substrate processing apparatus 1 then performs a drying processing (S15). Specifically, the substrate processing apparatus 1 shakes off the rinse liquid remaining on the wafer W by increasing the rotational speed of the wafer W, thus allowing the wafer W to be dried.

The substrate processing apparatus 1 then performs carrying-out processing (S16). Specifically, the substrate processing apparatus 1 stops the rotation of the wafer W, and carries the wafer W out of the chamber 20 by the substrate transfer device 17.

When the plating processing is performed as described above, vapor or mist of the plating liquid adheres to the heating unit 27. For this reason, the substrate processing apparatus 1 according to the exemplary embodiment performs the heating unit cleaning processing to be described below.

<Heating Unit Cleaning Processing>

Figure 8:
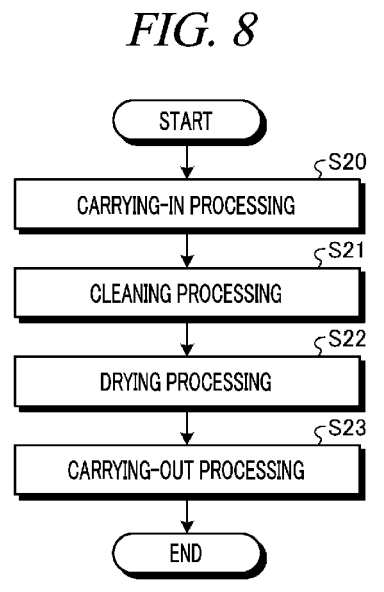

Now, the heating unit cleaning processing according to the exemplary embodiment will be described with reference to FIG. 8. FIG. 8 is a flowchart for describing the heating unit cleaning processing according to the exemplary embodiment. The heating unit cleaning processing is performed after the plating processing is performed on a predetermined number of wafers W, for example. Alternatively, the heating unit cleaning processing may be performed after a total processing time of the plating processing reaches a predetermined time, for example. Still alternatively, the heating unit cleaning processing may be performed at any required time in response to a manipulation from an operator, for example, when a cleaning operation button is manipulated in a maintenance mode.

The substrate processing apparatus 1 performs a carrying-in processing (S20). Specifically, in the substrate processing apparatus 1, the cleaning jig 40 is carried into the chamber 20 by the substrate transfer device 17, and the cleaning jig 40 is held by the substrate holder 21. The substrate holder 21 attracts the bottom surface of the plate member 41 of the cleaning jig 40 to hold the cleaning jig 40 horizontally.

The substrate processing apparatus 1 then performs a cleaning processing (S21). Specifically, the substrate processing apparatus 1 lowers the heating unit 27 to the heating position, and discharges the rinse liquid from the second cleaning liquid supply nozzle 26a while rotating the cleaning jig 40. The rinse liquid discharged from the second cleaning liquid supply nozzle 26a passes through the holes 44 of the cleaning jig 40 to be supplied to above the plate member 41 of the cleaning jig 40. Further, the substrate processing apparatus 1 may change the position of the heating unit 27 with respect to the heating position. Furthermore, the substrate processing apparatus 1 may discharge the rinse liquid from the second cleaning liquid supply nozzle 26a while changing the position of the heating unit 27.

The rinse liquid that has passed through the first holes 44a of the cleaning jig 40 collides with the wall member 42 and is supplied radially inwards, as indicated by a dashed-line arrow in FIG. 4. The rinse liquid supplied radially inwards then collides with a center side of the heating unit 27 to be diffused. As a result, the heating unit 27 on the radially inner side is cleaned by the rinse liquid.

The rinse liquid that has passed through the second holes 44b of the cleaning jig 40 is supplied radially outwards, as indicated by a dashed-line arrow in FIG. 5. The rinse liquid supplied radially outwards then collides with a peripheral side of the heating unit 27 to be diffused. As a result, the heating unit 27 on the radially outer side is cleaned by the rinse liquid. In this way, the rinse liquid is supplied to the heating unit 27 over the wide range in the radial direction to clean the heating unit 27 in the wide range.

The rinse liquid, which has come into contact with the blade member 43 as the cleaning jig 40 is rotated, is diffused to a wide range of the heating unit 27. As a result, the rinse liquid is supplied to the heating unit 27 over the wide range in the radial direction to clean the heating unit 27 in the wide range.

Further, when the cleaning jig 40 is rotated, a swirling flow is formed by the blade member 43, so that mist of the rinse liquid is diffused. Accordingly, the rinse liquid cleans the heating unit 27 over the wide range thereof.

Referring back to FIG. 8, the substrate processing apparatus 1 performs a drying processing (S22). Specifically, the substrate processing apparatus 1 stops the discharge of the rinse liquid from the second cleaning liquid supply nozzle 26a, and rotates the cleaning jig 40. For example, the processing apparatus 1 sets the rotational speed of the cleaning jig 40 to be higher than the rotational speed in the cleaning processing. As the cleaning jig 40 is rotated, the swirling flow is generated by the blade member 43 to dry the heating unit 27 and the inside of the chamber 20.

The substrate processing apparatus 1 then performs a carrying-out processing (S23). Specifically, the substrate processing apparatus 1 stops the rotation of the cleaning jig 40, and carries the cleaning jig 40 out of the chamber 20 by the substrate transfer device 17.

Effects

The substrate processing apparatus 1 includes the substrate holder 21, the rotational driving unit 22, the heating unit 27 (an example of the cover body), the substrate transfer device 17 (an example of the transfer mechanism), the second cleaning liquid supply 26 (an example of the cleaning liquid supply), and the controller 18. The substrate holder 21 holds the wafer W (an example of the substrate). The rotational driving unit 22 rotates the substrate holder 21. The heating unit 27 covers the top surface of the wafer W held by the substrate holder 21. The substrate transfer device 17 transfers the cleaning jig 40 to the substrate holder 21. The second cleaning liquid supply 26 supplies the rinse liquid (an example of the cleaning liquid) toward the bottom surface of the cleaning jig 40 held by the substrate holder 21. The controller 18 rotates the substrate holder 21 by controlling the rotational driving unit 22. The cleaning jig 40 is provided with at least one hole 44 through which the rinse liquid discharged from the second cleaning liquid supply 26 passes toward the heating unit 27.

With this configuration, in the substrate processing apparatus 1, the rinse liquid passing through the hole 44 is made to come into contact with the bottom surface of the heating unit 27, so that the heating unit 27 can be efficiently cleaned by the rinse liquid. For example, the substrate processing apparatus 1 is capable of efficiently cleaning the bottom surface of the heating unit 27 with the rinse liquid.

Further, the substrate processing apparatus 1 cleans the heating unit 27 by supplying the rinse liquid in the state that the cleaning jig 40 is held by the substrate holder 21. When the rinse liquid or the like adheres to a place where the wafer W is held by the substrate holder 21, for example, an attraction surface of a vacuum chuck of the substrate holder 21, a holding force for the wafer W in the substrate holder 21 may be reduced. When cleaning the heating unit 27 with the rinse liquid, the substrate processing apparatus 1 suppresses the rinse liquid from adhering to the attraction surface of the substrate holder 21, thus suppressing a decrease in the holding force for the wafer W in the substrate holder 21.

The cleaning jig 40 includes the plate member 41 and at least one wall member 42. The plate member 41 is held by the substrate holder 21. The wall member 42 extends from the plate member 41 toward the heating unit 27. The wall member 42 is formed such that the rinse liquid having passed through the hole 44 collides with it.

With this configuration, by causing the rinse liquid to collide with the wall member 42, the substrate processing apparatus 1 can diffuse the rinse liquid to the wide range of the heating unit 27. Thus, the substrate processing apparatus 1 is capable of cleaning the heating unit 27 efficiently.

The wall member 42 is formed so as to be orthogonal to the plate member 41.

With this configuration, the substrate processing apparatus 1 can supply the rinse liquid to the heating unit 27 on the center side in the radial direction, thus cleaning the heating unit 27 on the center side in the radial direction. Therefore, the substrate processing apparatus 1 is capable of cleaning the heating unit 27 efficiently.

The cleaning jig 40 includes the plate member 41 and at least one blade member 43. The blade member 43 extends from the plate member 41 toward the heating unit 27.

With this configuration, the substrate processing apparatus 1 can diffuse the rinse liquid that collides with the blade member 43. By generating the swirling flow with the blade member 43, the substrate processing apparatus 1 can diffuse the rinse liquid. Thus, the substrate processing apparatus 1 can supply the rinse liquid to the wide range of the heating unit 27, thus capable of cleaning the heating unit 27 efficiently. Further, by rotating the cleaning jig 40 after stopping the supply of the rinse liquid, the substrate processing apparatus 1 may generate the swirling flow with the blade member 43, thus allowing the inside of the chamber 20 to be rapidly dried by the swirling flow.

The substrate processing apparatus 1 is equipped with the plating liquid supply 23. The plating liquid supply 23 supplies the plating liquid to the top surface of the wafer W held by the substrate holder 21. The second cleaning liquid supply 26 supplies the rinse liquid toward the bottom surface of the wafer W held by the substrate holder 21.

With this configuration, the substrate processing apparatus 1 can clean the heating unit 27 by using the second cleaning liquid supply 26 configured to clean the bottom surface of the wafer W. That is, the substrate processing apparatus 1 is capable of cleaning the heating unit 27 with the existing device without needing to provide an additional rinse liquid supply device configured to clean the bottom surface of the heating unit 27.

Modification Examples

Figure 9:
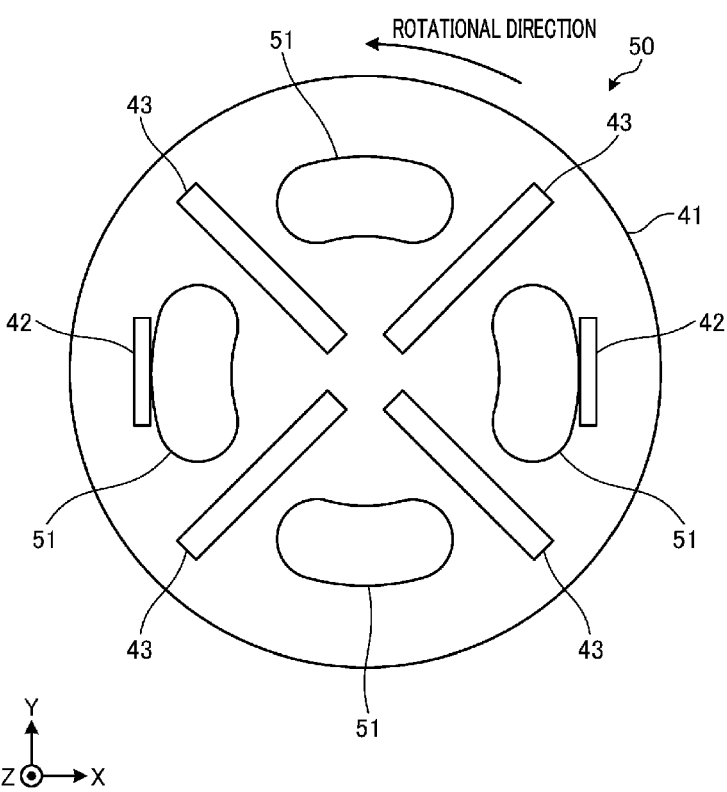
FIG. 9 is a plan view illustrating a configuration of a cleaning jig according to a modification example of the exemplary embodiment.

Holes 51 of a cleaning jig 50 according to a modification example may be formed along the circumferential direction of the cleaning jig 50, specifically, along the circumferential direction of the plate member 41, as illustrated in FIG. 9, for example. FIG. 9 is a plan view showing a configuration of the cleaning jig 50 according to the modification example of the exemplary embodiment. With this configuration, in the substrate processing apparatus 1 according to the modification example, the flow rate of the rinse liquid passing through the holes 51 can be increased, so that the cleaning efficiency for the heating unit 27 can be improved.

Figure 10:
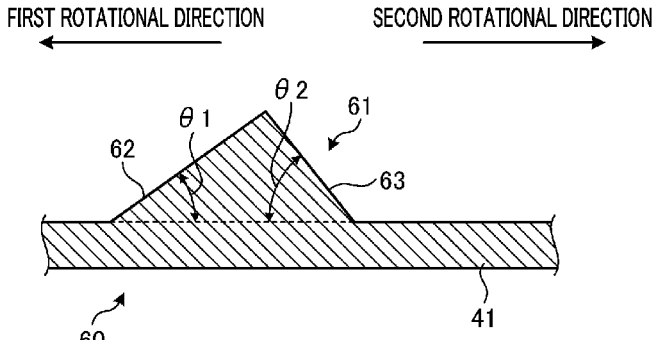
FIG. 10 is a diagram illustrating a cross section of a blade member in a cleaning jig according to a modification example of the exemplary embodiment.

A blade member 61 of the cleaning jig 60 according to another modification example may be provided with a first inclined surface 62 and a second inclined surface 63, as shown in FIG. 10, for example. FIG. 10 is a diagram illustrating a cross section of the blade member 61 in the cleaning jig 60 according to the modification example of the exemplary embodiment. The first inclined surface 62 has a first angle θ1 with respect to the plate member 41. The second inclined surface 63 has a second angle θ2 with respect to the plate member 41. The second angle θ2 is larger than the first angle θ1.

The rotational driving unit 22 of the substrate processing apparatus 1 according to the modification example is capable of rotating the substrate holder 21 in a first rotational direction and a second rotational direction opposite to the first rotational direction. That is, the substrate processing apparatus 1 according to the modification example is capable of rotating the cleaning jig 60 in forward and backward directions. When the cleaning jig 60 is rotated in the first rotational direction, the first inclined surface 62 is located at an upstream side in the rotational direction than the second inclined surface 63. When the cleaning jig 60 is rotated in the second rotational direction, the second inclined surface 63 is located at an upstream side in the rotational direction than the first inclined surface 62.

The substrate processing apparatus 1 according to the modification example rotates the substrate holder 21 in the first rotational direction during the cleaning processing in the heating unit cleaning processing. The substrate processing apparatus 1 according to the modification example diffuses the rinse liquid by the swirling flow formed by the first inclined surface 62. Further, the substrate processing apparatus 1 according to the modification example diffuses the rinse liquid that collides with the first inclined surface 62. In the substrate processing apparatus 1 according to the modification example, the rinse liquid can be diffused upwards by the first inclined surface 62, so that the heating unit 27 can be efficiently cleaned by the rinse liquid.

The substrate processing apparatus 1 according to the modification example rotates the substrate holder 21 in the second rotational direction during the drying processing in the heating unit cleaning processing. The processing apparatus 1 according to the modification example generates the swirling flow by the second inclined surface 63. In the substrate processing apparatus 1 according to the modification example, the swirling flow having a higher flow velocity than the swirling flow generated by the rotation in the first rotational direction can be generated by the second inclined surface 63, so that the inside of the chamber 20 can be dried efficiently.

In the substrate processing apparatus 1 according to the modification example, a nozzle configured to supply the rinse liquid to the bottom surface of the wafer W in the plating processing and a nozzle configured to supply the rinse liquid in the heating unit cleaning processing may be different nozzles. By way of example, the nozzle that supplies the rinse liquid to the bottom surface of the wafer W in the plating processing and the nozzle that supplies the rinse liquid in the heating unit cleaning processing have different discharge angles for discharging the rinse liquid. With this configuration, the substrate processing apparatus 1 according to the modification example is capable of discharging the rinse liquid at an appropriate discharge angle in each processing.

Figure 11:
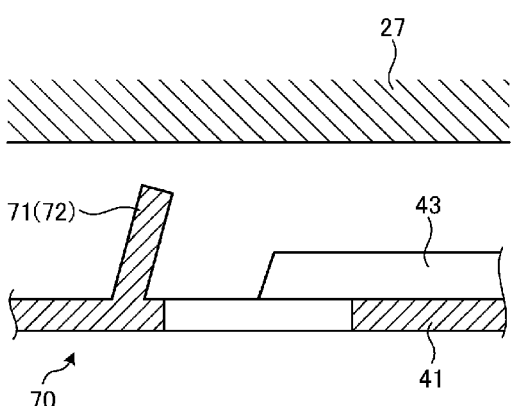
FIG. 11 is a diagram illustrating a cross section of a first wall member in a cleaning jig according to a modification example of the exemplary embodiment.
Figure 12:
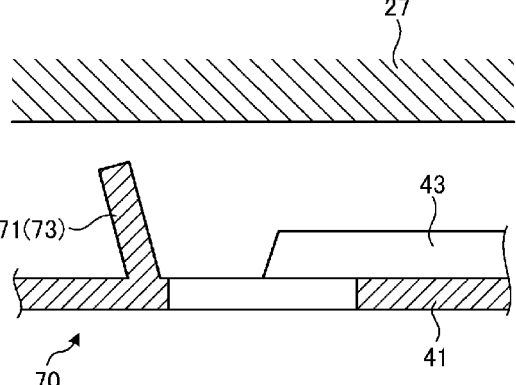
FIG. 12 is a diagram illustrating a cross section of a second wall member in the cleaning jig according to the modification example of the exemplary embodiment.

A wall member 71 of a cleaning jig 70 according to still another modification example is formed to be inclined with respect to the plate member 41. The wall member 71 includes at least one of a first wall member 72 shown in FIG. 11 and a second wall member 73 shown in FIG. 12. FIG. 11 is a diagram showing a cross section of the first wall member 72 of the cleaning jig 70 according to the modification example of the exemplary embodiment. FIG. 12 is a diagram showing a cross section of the second wall member 73 of the cleaning jig 70 according to the modification example of the exemplary embodiment. Each of FIG. 11 and FIG. 12 is a cross sectional view at a position corresponding to IV-IV of FIG. 3. The first wall member 72 is formed such that its upper end faces a radially inner side of the cleaning jig 70. The second wall member 73 is formed such that its upper end faces a radially outer side of the cleaning jig 70.

In addition, the wall member 71 may include both first wall member 72 and the second wall member 73. The wall member 71 may include two or more of the wall members 42 (see FIG. 4) orthogonal to the plate member 41, the first wall member 72, and the second wall member 73.

In the substrate processing apparatus 1 according to the modification example, the rinse liquid can be diffused over the wide range by at least one of the first wall member 72 and the second wall member 73, so that the heating unit 27 can be efficiently cleaned.

In the substrate processing apparatus 1 according to the modification example, the accumulation of the plating liquid and the heating of the plating liquid may be performed by using different chambers. Further, the substrate processing apparatus 1 according to the modification example is not limited to the one configured to perform the plating processing, and it may be an apparatus configured to perform a processing by supplying various kinds of processing liquids to the wafer W.

The above-described exemplary embodiment and modification examples may be combined in various ways. For example, in the cleaning jig 40, the holes 51 may be formed in the circumferential direction of the cleaning jig 40, and the blade member 43 may have the first inclined surface 62 and the second inclined surface 63. As another example, in the cleaning jig 40, the holes 51 may be formed in the circumferential direction of the cleaning jig 40, and the wall member 42 may include at least one of the first wall member 72 and the second wall member 73.

The exemplary embodiments disclosed herein are illustrative in all aspects and do not limit the present disclosure. In fact, the above exemplary embodiments can be embodied in various forms. Further, the above-described exemplary embodiments may be omitted, replaced, or modified in various forms without departing from the scope and spirit of the appended claims.

According to the exemplary embodiment, it is possible to clean the cover body efficiently.

I claim:

1. A cleaning method, comprising:

transferring a cleaning jig to a substrate holder allowed to hold a substrate;

rotating the substrate holder holding the cleaning jig thereon;

discharging a cleaning liquid toward a bottom surface of the cleaning jig held by the substrate holder; and cleaning a cover body covering a top surface of the cleaning jig with the cleaning liquid, wherein the cleaning jig comprises a plate member and the cleaning jig is provided with multiple holes through which the cleaning liquid discharged from a cleaning liquid supply passes toward the cover body, and wherein the cleaning jig further comprises a plurality of blade members, each disposed between two adjacent ones of the multiple holes and extending in a radial direction of the plate member.

\* \* \* \* \*